United States Patent
Venkataraghavan et al.

(10) Patent No.: US 7,950,596 B2
(45) Date of Patent: May 31, 2011

(54) DISTRIBUTED STIFFNESS BIASING SPRING FOR ACTUATOR SYSTEM AND FUEL INJECTOR USING SAME

(75) Inventors: Jay Venkataraghavan, Dunlap, IL (US); Michael Long, Metamora, IL (US); Zhenlong Xu, Peoria, IL (US); Stephen Lewis, Chillicothe, IL (US)

(73) Assignee: Caterpillar Inc., Peoria, IL (US)

( * ) Notice: Subject to any disclaimer, the term of this patent is extended or adjusted under 35 U.S.C. 154(b) by 355 days.

(21) Appl. No.: 12/215,545

(22) Filed: Jun. 27, 2008

(65) Prior Publication Data

US 2009/0321668 A1 Dec. 31, 2009

(51) Int. Cl.
*B05B 1/08* (2006.01)
*B05B 1/30* (2006.01)
*F02M 45/00* (2006.01)
*F02M 61/20* (2006.01)
*F16F 1/18* (2006.01)

(52) U.S. Cl. ............... 239/102.2; 239/102.1; 239/533.4; 239/533.9; 239/533.15; 267/160; 267/180; 267/182; 29/25.35

(58) Field of Classification Search ............... 239/102.2, 239/533.4–533.15; 123/299, 446, 447, 467, 123/468; 267/160, 180, 182; 29/25.35, 451, 29/450, 594; 310/338, 369, 348
See application file for complete search history.

(56) References Cited

U.S. PATENT DOCUMENTS

| | | | |
|---|---|---|---|
| 2,087,354 A | 4/1936 | Muffly | |
| 2,171,185 A | 12/1936 | Maier | |
| 3,042,391 A | 9/1959 | Glaser | |
| 4,339,308 A * | 7/1982 | Harris | 202/263 |
| 4,790,700 A | 12/1988 | Schwartzman | |
| 4,858,897 A | 8/1989 | Irifune | |
| 5,160,121 A | 11/1992 | Bartholomew | |
| 6,199,676 B1 * | 3/2001 | Targiroff | 193/25 B |
| 6,663,015 B2 | 12/2003 | Yamada et al. | |
| 6,681,462 B1 * | 1/2004 | Frank et al. | 29/25.35 |
| 7,025,292 B2 | 4/2006 | Mohr | |
| 7,175,112 B2 | 2/2007 | Uhlmann | |
| 7,222,424 B2 | 5/2007 | Jovovic et al. | |
| 7,267,111 B2 | 9/2007 | Liskow | |
| 2003/0034594 A1 | 2/2003 | Schmieder et al. | |
| 2003/0127615 A1 * | 7/2003 | Fischer et al. | 251/57 |
| 2004/0026839 A1 | 2/2004 | Schmieder et al. | |
| 2005/0017096 A1 * | 1/2005 | Bachmaier et al. | 239/584 |
| 2006/0113870 A1 | 6/2006 | Kienzler et al. | |
| 2006/0284740 A1 | 12/2006 | Boecking et al. | |
| 2007/0084949 A1 * | 4/2007 | Augustin | 239/533.11 |
| 2007/0090724 A1 | 4/2007 | Kato et al. | |

FOREIGN PATENT DOCUMENTS

| | | |
|---|---|---|
| EP | 1519072 | 3/2005 |
| EP | 1605159 | 12/2005 |

* cited by examiner

*Primary Examiner* — Dinh Q Nguyen
*Assistant Examiner* — Justin Jonaitis
(74) *Attorney, Agent, or Firm* — Liell & McNeil

(57) ABSTRACT

A fuel injector includes a fuel injector body defining a fuel inlet and at least one fuel outlet, a valve having a first valve state and a second valve state and an actuator for the valve. The fuel injector includes a biasing spring including a cylindrical rolled sheet having a first spring end, a second spring end and defining a longitudinal center axis. The cylindrical rolled sheet is configured to change in length to bias the actuator toward the first actuator position and includes a helical seam located between the first spring end and a second spring end which has a shape adapted to reduce non-uniformity in a spring constant via distributing stiffness about the longitudinal center axis.

19 Claims, 2 Drawing Sheets

DISTRIBUTED STIFFNESS BIASING SPRING FOR ACTUATOR SYSTEM AND FUEL INJECTOR USING SAME

TECHNICAL FIELD

The present disclosure relates generally to biasing devices used in connection with actuators, and relates more particularly to distributing stiffness within a biasing spring about a longitudinal center axis to reduce non-uniformity in a spring constant thereof.

BACKGROUND

A great many types of actuator systems are known from diverse technical fields. Actuator systems range from relatively large, slow and imprecise devices, to relatively small, rapidly actuating and highly precise systems such as the type known from fuel injectors and other fluid control systems. In many instances, it is desirable to bias an actuator toward a particular state, such as a predefined position. In the context of fuel injectors, biasing springs are commonly used to bias an actuator or related components toward one of multiple possible positions. For example, return springs are often used in connection with control valves and associated electrical actuators to bias the electrical actuator toward a position corresponding with a particular fluid state of a fuel injector such as a rest state when the fuel injector is not injecting fuel into an engine cylinder. With the ever increasing focus on precision, reliability and predictability in actuator systems, notably fuel injector actuator systems, the behavior of return springs and other biasing devices is increasingly important.

Another common application of biasing devices is providing a preload on certain types of actuators such as piezoelectric actuators. Like other common actuator systems used in fuel injectors, piezoelectric actuators may be activated or deactivated to control the position of a control valve or the like. To enable operation and to ensure accurate, reliable and predictable performance, many piezoelectric actuators are preloaded via a compressive force. Piezoelectric actuators tend to be somewhat sensitive to variations in preload. Moreover, as engine conditions such as temperature change, the dimensions and spacing of piezoelectric actuator components can change. The magnitude of preloading force on piezoelectric actuators used in fuel injectors may be tightly specified for these reasons. As alluded to above, the behavior of return springs and other biasing devices may be important in ensuring desired operation of an actuator. It has been observed that variability in spring construction and design can negatively impact the ability of a biasing spring to perform as desired in certain actuator systems. In the case of piezoelectric actuators, the biasing spring may be used not only as a preloading device, but also as a return spring to return the actuator to a state it normally occupies when de-energized, compounding these issues.

U.S. Pat. No. 7,025,292 to Mohr sets forth one example of a fuel injector having a valve biased via a biasing spring. The spring used in Mohr has the form of a cylindrical sleeve with cut-out regions to impart a spring action to the sleeve. Mohr may have certain applications, but would be considered inferior in others, particularly if applied in certain piezoelectric actuator systems.

SUMMARY

A fuel injector includes a fuel injector body, defining a fuel inlet and at least one fuel outlet. A valve having a first valve state and a second valve state is configured to control a flow of a fluid within the fuel injector body via switching between the first valve state and the second valve state. An actuator for the valve is provided which is movable between a first actuator position corresponding to the first valve state and a second actuator position corresponding to the second valve state. The fuel injector further includes a biasing spring including a cylindrical rolled sheet having a first spring end and a second spring end defining a longitudinal center axis, the cylindrical rolled sheet being configured to change in length to bias the actuator toward the first actuator position. The biasing spring further has a helical seam located between the first spring end the second spring end which has a shape adapted to reduce non-uniformity in a spring constant of the cylindrical rolled sheet at least in part by distributing weld stiffness about the longitudinal center axis.

In another aspect, a method of operating an electrical actuator system includes a step of changing an electrical energy state of an electrical actuator of the electrical actuator system, and moving a control element coupled with the electrical actuator against a bias of a biasing spring in response to the step of changing an electrical energy state. The biasing spring includes a cylindrical rolled sheet defining a longitudinal center axis. The method further includes a step of reducing non-uniformity in a spring constant of the cylindrical rolled sheet during the step of moving at least in part by distributing stiffness within the cylindrical rolled sheet about the longitudinal center axis via a helical seam of the cylindrical rolled sheet.

In still another aspect a biasing device for an actuator includes a biasing spring including a cylindrical rolled sheet having a first spring end and a second spring end and defining a longitudinal center axis, the cylindrical rolled sheet being configured to change in length in a direction parallel to the longitudinal center axis to bias the actuator. The cylindrical rolled sheet further has a helical seam located between the first spring end and the second spring end and having a shape adapted to reduce non-uniformity in a spring constant of the biasing spring at least in part by distributing stiffness about the longitudinal center axis of the cylindrical rolled sheet.

DETAILED DESCRIPTION

Figure 1:
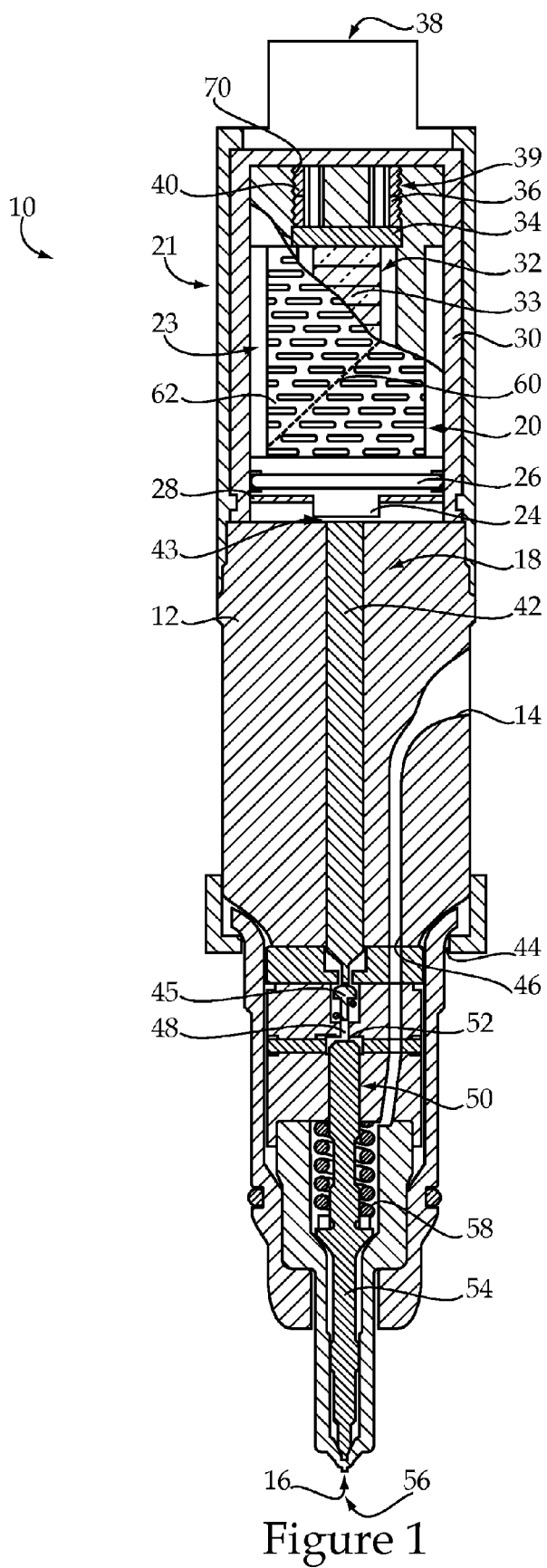
FIG. 1 is a partially sectioned side diagrammatic view of a fuel injector, according to one embodiment.

Referring to FIG. 1, there is shown a fuel injector 10 according to one embodiment. Fuel injector 10 may include a fuel injector body 12 having a first end 38 and a second end 56, and including a plurality of different body components. Fuel injector body 12 may define at least one fuel inlet 14 and at least one fuel outlet 16 and a high pressure fuel passage 46, such as a nozzle supply passage, fluidly connecting fuel inlet 14 with outlet 16. In one embodiment, fuel inlet 14 may be configured to connect with a source of high pressure fluid (not shown) such as a common rail of the type commonly used in connection with internal combustion engine systems. It should be appreciated, however, that fuel injector 10 might be used in engine systems having a mechanism other than a common rail for pressurizing fuel, such as a unit pump coupled with fuel injector 10. Moreover, in other embodiments certain aspects of the present disclosure might be implemented in a context other than fuel systems, as will be apparent from the following description.

Fuel injector 10 may further include a needle check 50 having a first needle check position at which needle check 50 blocks the at least one fuel outlet 16, and a second needle check position at which the needle check 50 does not block the at least one fuel outlet 16. Needle check 50 may include a needle valve member 54 biased towards a closed position via a biasing spring 58 at which it blocks outlet 16. Valve member 54 may further include a control surface 52, which is exposed to a fluid pressure of a control passage 48 defined by injector body 12 and fluidly connecting with passage 46. Fuel injector 10 may further include a control valve assembly 18 which is configured to control operation of needle check 50 by moving between a first control valve state and a second control valve state. Control valve assembly 18 further includes a control valve member 42 which switches between a first control valve position corresponding to the first valve state and a second control valve position corresponding to the second control valve state to control a flow of fluid within fuel injector body 12. A second control valve member 45 may be coupled with control valve member 42. When control valve member 42 is in the first control valve position, control surface 52 may be exposed via control passage 48 to a pressure of high pressure fuel supplied via inlet 14, and when control valve member 42 is in the second control valve position, control surface 52 may be exposed to a low pressure of a low pressure outlet 44 defined by fuel injector body 12.

Fuel injector body 12 may further include an actuator subassembly 21 such as an electrical actuator subassembly coupled with control valve assembly 18. Actuator subassembly 21 may be part of an actuator system 23 and includes a casing 30 having an electrical actuator 32 such as a piezoelectric element that includes a piezoelectric stack 33 positioned therein. Actuator subassembly 21 may further include a biasing spring 20 having a spring body 62, and electrical actuator 32 may be positioned at least partially within biasing spring 20. Actuator subassembly 21 may still further include a control element 24 configured to control the state of another element of fuel injector 10, such as control valve member 42. Control element 24 may include a contact element also identified via reference numeral 24 configured to control the state of a second element of fuel injector 10, such as control valve member 42, via contacting the second element. In other embodiments, control element 24 might control the state of another element of fuel injector 10 without contacting the same, such as by varying a fluid pressure. In one further embodiment, control element 24 might include and be integral with a valve member such as control valve member 42, which in turn controls the state of yet another element such as needle check 50. It is contemplated that contact with another element to control the state thereof, however, will be a practical implementation strategy, and the term "contact element 24" is used hereinafter, but is not intended to be limiting.

Actuator 32 will typically be held in compression via biasing spring 20 and configured to change in length in response to a change in an electrical energy state of actuator 32 to actuate control valve assembly 18. In one embodiment, actuator 32 may be energized from a de-energized state to responsively lengthen and move contact element 24 to contact control valve member 42. Switching actuator 32 between an energized state and a de-energized state can selectively connect control passage 48 with passage 46 or outlet 44 in a known manner via control valve member 42 and second valve member 45. In one embodiment, contact element 24 may be separated from control valve member 42 via a gap 43 defined by contact element 24 and control valve member 42 when actuator 32 is in a de-energized state. Contacting control valve member 42 via contact element 24 moves control valve member 42 between the first and second control valve positions mentioned above. In other embodiments, changing the electrical energy state of actuator 32 could include de-energizing actuator 32 to change a length of actuator 32, adjusting actuator 32 from a low electrical energy state to a higher electrical energy state, etc. In addition, in other embodiments actuator 32 might not be held in compression via biasing spring 20, or might be a different type of actuator. Biasing spring 20 could also act on a different component than on actuator 20, such as on control valve member 42 or on contact element 24. The present disclosure should thus be broadly construed to contemplate a variety of different systems having a variety of different components and component arrangements, where a first component moves to affect the position or state of another component.

Actuator subassembly 21 may further include a flexible diaphragm 28 coupled to move with contact element 24, and an O-ring 26 fluidly sealing between biasing spring 20 and casing 30. As mentioned above, actuator 32 may be a piezoelectric actuator and biasing spring 20 may compress actuator 32 to preload actuator 32. To this end, biasing spring 20 may be in a tensioned state, and energizing actuator 32 may lengthen actuator 32 against a compressive bias of biasing spring 20. Lengthening actuator 32 against a compressive bias of biasing spring 20 may in turn be understood as moving contact element 24 and therefore control valve member 42 against the compressive bias. It will further be appreciated that moving control valve member 42 via contact with contact element 24 can control a fuel injection timing via fuel injector 10. Fuel injector body 12 may further include a threaded preload control nut 36 having a set of external threads 39, for example, for varying the tension on biasing spring 20, and a threaded lock nut 40 to lock biasing spring 20 at a given tension state. Threading nut 36 relatively deeper into biasing spring 20, via engaging threads 39 with a set of internal threads 70 of biasing spring 20 can stretch biasing spring 20 to increase a preload, and vice versa. A preload control element 34, for example, including a thermally expansive or thermally contractive material may be positioned adjacent actuator 32 to expand or contract in response to changes in temperature and thereby maintain or control a preload on actuator 32. The general construction and operating principles of preloading and controlling a preload on an actuator via the use of nuts 36 and 40 and preload control element 34 are described in more detail in co-pending and commonly owned U.S. patent application Ser. No. 12/077,640, filed Mar. 20, 2008.

Figure 2:
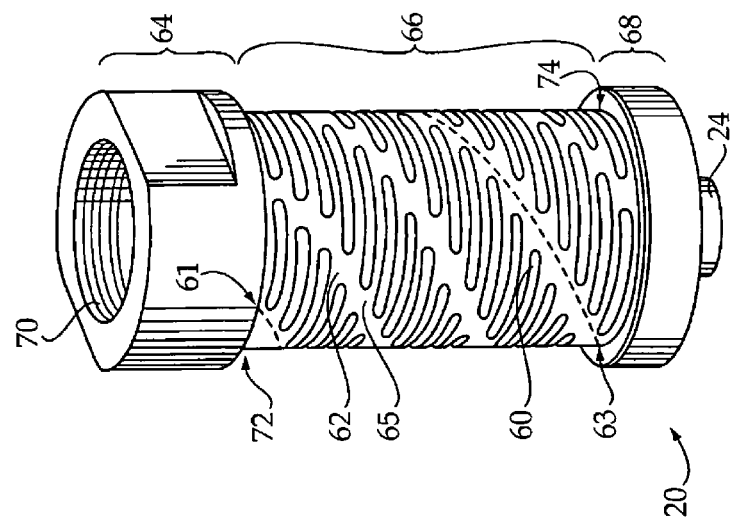
FIG. 2 is an isometric view of a spring according to one embodiment.

Turning now to FIG. 2, there is shown biasing spring 20 in an isometric view. In one embodiment, biasing spring 20 may include a multi-function spring, having as one function the biasing of actuator 32 and having additional functions such as setting a preload on actuator 32 and translating a motion of actuator 32. Biasing spring 20 may include a plurality of longitudinal spring segments, including a first spring segment 68, a second spring segment 66 and a third spring segment 64. In one embodiment, segment 64 may include internal threads 70 which are configured to mate with nut 36 and nut 40 to adjust a tension on biasing spring 20, and adjust or set a preload on actuator 32 at a desired preload, as discussed above.

Segment 68 may be or include a piston configured to translate a motion of actuator 32, and includes contact element 24 located thereon. Segment 66 may include spring body 62 and is configured to generate all or at least a portion of a spring force of biasing spring 20. Spring body 62 may include a first spring end 72 and a second spring end 74. In one embodiment, each of segments 64 and 68 may be welded or joined via any other suitable technique to segment 66 at spring ends 72 and 74, respectively. It should be appreciated that a wide variety of spring configurations, such as multi-functional and uni-functional, are contemplated herein and the illustration in FIG. 2 is purely illustrative. Moreover, while a multi-function biasing spring is one practical implementation strategy, the present disclosure is not thereby limited.

Figure 3:
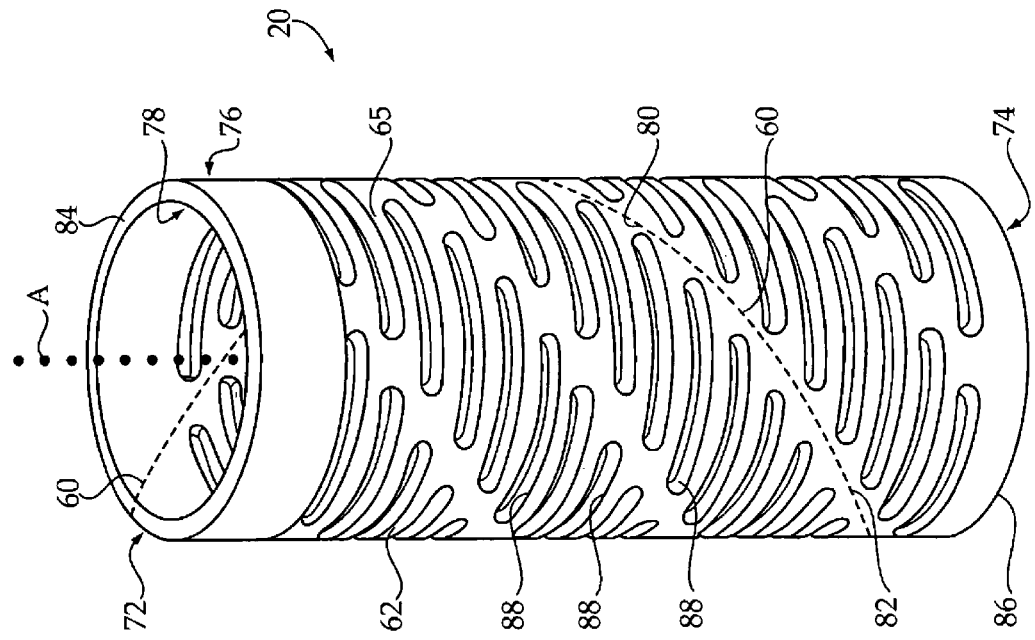
FIG. 3 is an isometric view of a spring body of a biasing device for an actuator, according to one embodiment.

Referring also to FIG. 3, illustrating an isometric view of spring body 62 of biasing spring 20, biasing spring 20 may include a cylindrical rolled sheet 65 such as a rolled metallic sheet forming spring body 62. Cylindrical rolled sheet 65 and spring body 62 are in one embodiment the same component, and thus the present description of spring body 62 should be understood to refer also to descriptions of cylindrical rolled sheet 65 herein. In one embodiment, spring body 62 may be rolled from a flat sheet of steel or the like having a pre-rolled shape generally of a flat parallelogram. Spring body 62 may include a plurality of straight peripheral edges, including a first straight peripheral edge 84 at first spring end 72, a second straight peripheral edge 86 at second spring end 74, a third straight peripheral edge 80 and a fourth straight peripheral edge 82. The term "peripheral" as used herein should be understood to refer to edges being peripheral of the flat sheet which is rolled to form spring body 62.

In one embodiment, spring body 62 may have a right cylindrical shape defining a longitudinal center axis A, and a uniform width in a dimension orthogonal to longitudinal center axis A. Spring body 62 may also include an outer diameter 76 and an inner diameter 78 and a uniform thickness between outer diameter 76 and inner diameter 78. It should be appreciated that in certain embodiments, spring body 62 might be non-uniformly thick, a different shape from a right cylinder or have a non-uniform width. Generally uniform shape characteristics are considered to be a practical implementation strategy, however. Spring body 62 may further include a plurality of voids 88 communicating between inner diameter 78 and outer diameter 76. Voids 88 may be formed in spring body 62, for example via machining or laser cutting, prior to rolling sheet 65 into a cylindrical shape, but might be formed after rolling in other embodiments. If spring body 62 is found to have a higher stiffness than desired, or a non-uniform stiffness, after forming cylindrical rolled sheet 65 into spring body 62, voids 88 may be formed therein to result in the desired characteristics. Voids 88 may have a shape, arrangement, size and number defining in part a spring constant of spring body 62. In one embodiment, voids 88 may all have the same shape such as an ellipsoid shape, a circular shape or an elongate, straight-edged shape having rounded ends as shown, and may be uniformly distributed in spring body 62. In other embodiments, voids 88 might have different shapes from one another or might be non-uniformly distributed. In general, where the number of voids 88 of a given size is greater, spring body 62 may have a relatively lower spring constant and where the number of voids 88 of a given size is lesser, spring body 62 may have a relatively higher spring constant. In one further embodiment, voids 88 may be selectively formed in spring body 62 to tailor the stiffness of spring body 62, for example to increase uniformity of the stiffness longitudinally or radially. Further, voids 88 may also be used to tailor stiffness of spring body 62 to a desired stiffness. In either case, tailoring stiffness to achieve greater uniformity or tailoring stiffness to achieve a desired stiffness, the geometry, including shape or arrangement, of voids 88, their density in spring body 62 or their size or number, may be used to make certain areas of spring body 62 relatively stiffer or relatively less stiff. Voids 88 may be formed prior to rolling sheet 65, after rolling sheet 65, or both.

Peripheral edges 80 and 82 may be joined at a helical weld seam 60 which is located between first spring end 72 and second spring end 74. Although described throughout as weld seam 60, the seam 60 between peripheral edges 80 and 82 may also be formed via any other suitable connection. Weld seam 60 is located in middle segment 66 and is uniquely configured to affect the spring characteristics of spring body 62, as further described herein. In particular, weld seam 60 has a shape adapted to reduce non-uniformity in the spring constant of spring body 62 at least in part by distributing weld stiffness about longitudinal center axis A. Weld seam 60 may have a helical shape, meaning that at least a portion of weld seam 60 defines a helix. It should be appreciated that weld seam 60 need not have a uniform helical angle about longitudinal axis A. In other words, the relative inclination of weld seam 60 relative to a vertical axis corresponding to longitudinal axis A might vary along a length of weld seam 60. For example, weld seam 60 could have a zigzag configuration, or be only partially helical, and still define a helix. Weld seam 60 could also include vertical or horizontal components. In one practical implementation strategy, however, weld seam 60 may have a uniform helical angle from a first helix end 63 to a second helix end 61. Weld seam 60 may also be circumferential of spring body 62 and helix end 63 may be coterminous with spring end 74 whereas helix end 61 may be coterminous with spring end 72. In one practical implementation strategy, weld seam 60 may have a radial path about longitudinal center axis A which is an integer multiple of 360°, and may be substantially equal to 360°.

As mentioned above, weld seam 60 may be configured to reduce non-uniformity in the spring constant of spring body 62. In one embodiment, weld seam 60 may reduce radial non-uniformity in the spring constant at least in part by distributing stiffness radially about spring body 62. Spring body 62 may, within weld seam 60 and in regions adjacent weld seam 60, be relatively stiffer than in other regions such as regions adjacent voids 88. It has been discovered that where a spring such as spring body 62 includes relatively stiffer portions and relatively less stiff portions, the spring may behave unreliably, unpredictably and/or non-uniformly. As mentioned above, in the case of certain actuator systems such as piezoelectric actuator systems, non-uniformity in spring behavior can negatively impact performance of a system, for example by reducing the accuracy of fuel injection timing. Weld seam 60 tends to impart a relatively greater stiffness to portions of spring body 62 than a stiffness associated with other portions of spring body 62, such as those adjacent voids 88. Voids 88 may therefore define a first stiffness coefficient of spring body 62, whereas weld seam 60 may define a second, greater stiffness coefficient of spring body 62. By forming weld seam 60 as described herein, the relatively greater stiffness associated therewith can be distributed radially about spring body 62. In one practical implementation strategy, voids 88 are offset from weld seam 60 and do not intersect weld seam 60, although designs wherein one or more voids are intersected by weld seam 60 may still fall within the scope of the present disclosure. For instance, voids might be formed in spring body 62 which intersect weld seam 60 to decrease stiffness or to increase uniformity in the spring constant of spring body 62. In certain earlier springs formed from a rolled sheet, weld seams were formed longitudinally and therefore oriented generally parallel a longitudinal center axis of the associated spring. This approach tends to concentrate material having a relatively greater stiffness, i.e. the weld, in a limited radial area of the spring. When a load is applied to a spring of such a design, the spring tends to expand or contract more in less stiff radial segments than in relatively more stiff radial segments, due to radial non-uniformity in a spring constant of the spring.

The present disclosure utilizes a different approach where, rather than concentrating stiffness, the stiffness associated with weld seam 60 is distributed radially about spring body 62. In one practical implementation strategy, any given radial segment of spring body 62 will tend to have a spring constant substantially equal to any other radial segment. In addition to radial uniformity, linear uniformity in spring behavior may also be improved. Those skilled in the art will appreciate that as a conventional spring is compressed or expanded, the force required to impart additional compression or expansion tends to increase, according to the spring constant. For certain actuator systems, such as fuel injector systems, it may be desirable to utilize springs where the change in the force required to further compress or expand a spring is relatively linear in a service range for the particular spring. Earlier springs having relatively stiff sections in certain radial segments, such as a longitudinal weld seam, tended to throw off the linearity sought in the spring behavior, in addition to behaving radially non-uniformly.

INDUSTRIAL APPLICABILITY

Referring to the drawings generally, a fuel, such as diesel fuel, may be supplied at a relatively high pressure to inlet 14, and thenceforth to passage 46. High pressure fuel may flow from passage 46 into control passage 48 to apply a high pressure to closing hydraulic surface 52, holding needle valve member 54 in a closed position and blocking outlet 16. As discussed above, biasing spring 20 may be exerting a compressive bias on actuator 32. When initiation of a fuel injection event is desired, actuator 32 may be energized. As a result, actuator 32 will tend to lengthen, moving contact element 24 across gap 43 to contact valve member 42, and moving valve member 42 down in the FIG. 1 illustration. Valve member 42 may in turn move valve member 45 down in the FIG. 1 illustration to fluidly connect control passage 48 with low pressure outlet 44, allowing fluid pressure from passage 46 to act on needle valve member 54 and lift needle valve member 54 away from its position blocking outlet 16. It should be appreciated that control passage 48 may fluidly connect with passage 46 and with outlet 44 as described herein via passages between and among components of fuel injector body 12 which are either too small to readily illustrate in FIG. 1, or are not within the section plane shown. When actuator 32 is energized, biasing spring 20 may change in length, such as in the illustrated embodiment increasing in length in a direction parallel to the longitudinal center axis A. When actuator 32 is de-energized, it may shorten in length via the biasing force of biasing spring 20, allowing valve members 42 and 45 to move upward, and blocking the low pressure outlet from control passage 48. As a result, high pressure in control passage 48 may be reestablished via fluid pressure from passage 46, and the fluid pressure acting on control surface 52 can move needle valve member 54 back to a position at which it blocks outlet 16.

During changing length of spring body 62 via energizing and de-energizing actuator 32, spring body 62 will tend to behave more reliably and predictably than in earlier designs not having a weld seam 60 configured as described herein. This is contemplated to provide for improved performance in operation of the overall system of which actuator 32 is a part. It should further be appreciated that when actuator 32 is de-energized, the preloading force exerted via spring 20 on actuator 32 will tend to be more uniform and predictable than that possible or at least practicable with certain other spring designs. Greater uniformity in spring constant is thus contemplated to provide for improved performance during operation of an actuator system, and also greater ease in setting an accurate preload on a piezoelectric element prior to placing it in service. Those skilled in the art will further appreciate that many recent advances in engine operating strategies rely upon the injection of highly precise quantities of fuel, at a highly precise timing. While piezoelectric actuators have shown much promise of application to fuel systems to achieve these and other goals, the relative sensitivity of piezoelectric actuators to inaccurate preloading have in some cases prevented their use in engine systems where they might otherwise be advantageously used. The relatively greater uniformity in spring constant available via the present disclosure is contemplated to enable the use of piezoelectric actuators in some instances, and with certain desirable spring types such as those disclosed herein, where their use would otherwise not be available.

The present description is for illustrative purposes only, and should not be construed to narrow the breadth of the present disclosure in any way. Thus, those skilled in the art will appreciate that various modifications might be made to the presently disclosed embodiments without departing from the full and fair scope and spirit of the present disclosure. Other aspects, features and advantages will be apparent upon an examination of the attached drawings and appended claims.

What is claimed is:

1. A fuel injector comprising:
 a fuel injector body, defining a fuel inlet and at least one fuel outlet;
 a valve having a first valve state and a second valve state, and being configured to control a flow of a fluid within the fuel injector body via switching between the first valve state and the second valve state;
 an actuator for the valve which is movable between a first actuator position corresponding to the first valve state and a second actuator position corresponding to the second valve state; and
 a biasing spring including a cylindrical rolled sheet having a first spring end, a second spring end and defining a longitudinal center axis, the cylindrical rolled sheet being configured to change in length to bias the actuator toward the first actuator position and further having a helical weld seam located between the first spring end and the second spring end which has a shape adapted to reduce non-uniformity in a spring constant of the cylindrical rolled sheet, and the helical weld seam including a radial path having a turn about the longitudinal center axis substantially equal to 360°, such that a stiffness of the helical weld seam is distributed within the cylindrical rolled sheet with radial uniformity.

2. The fuel injector of claim 1 wherein the helical seam defines a helix having a first helix end coterminous with the first spring end and a second helix end coterminous with the second spring end, and a uniform helical angle relative to the longitudinal center axis from the first helix end to the second helix end.

3. The fuel injector of claim 2 wherein the helical seam is circumferential of the cylindrical rolled sheet.

4. The fuel injector of claim 3 wherein the radial path about the longitudinal center axis is an integer multiple of 360°.

5. The fuel injector of claim 2 wherein the cylindrical rolled sheet includes a plurality of straight peripheral edges, including a first straight peripheral edge at the first end of the cylindrical rolled sheet, a second straight peripheral edge at the second end of the cylindrical rolled sheet, and a third straight peripheral edge and a fourth straight peripheral edge joined at the seam.

6. The fuel injector of claim 5 wherein:
the cylindrical rolled sheet includes an inner diameter and an outer diameter and defines a plurality of voids communicating between the inner diameter and the outer diameter, the plurality of voids having a shape, arrangement and number;
wherein the spring constant includes a net spring constant defined in part by the shape, arrangement and number of the plurality of voids and also in part by the shape of the helical seam.

7. The fuel injector of claim 6 wherein the plurality of voids are offset from the helical seam and are not intersected by the helical seam, the plurality of voids defining a first stiffness coefficient of the cylindrical rolled sheet and the helical seam defining a second, greater stiffness coefficient of the cylindrical rolled sheet.

8. The fuel injector of claim 1 further comprising a needle check movable between a first needle check position blocking the at least one fuel outlet and a second needle check position at which the needle check does not block the at least one fuel outlet, wherein the valve includes a control valve configured to control moving of the needle check between the first needle check position and the second needle check position, and wherein the actuator includes an electrical actuator coupled with the control valve and having an energized state and a de-energized state.

9. The fuel injector of claim 8 further comprising a contact element configured to translate a motion of the actuator to the control valve, the contact element being separated from the control valve via a gap when the electrical actuator is in the de-energized state.

10. The fuel injector of claim 8 wherein the fuel injector body further defines a high pressure fuel passage fluidly connecting the fuel inlet with the at least one nozzle outlet, a control passage and a low pressure outlet, wherein the needle check includes a closing hydraulic surface exposed to a fluid pressure of the control passage and wherein the valve is movable via switching the electrical actuator between the energized state and the de-energized state to selectively connect the control passage with the high pressure passage or the low pressure outlet.

11. The fuel injector of claim 10 wherein the actuator includes a piezoelectric actuator having a piezoelectric stack, and wherein the biasing spring is in a tensioned state and holds the piezoelectric stack in compression at least partially within the cylindrical rolled sheet.

12. The fuel injector of claim 11 wherein the biasing spring includes a multi-function spring having a plurality of longitudinal segments, including a first longitudinal segment having a piston configured to translate a motion of the piezoelectric element, a second longitudinal segment which includes the cylindrical rolled sheet and the helical seam and a third longitudinal segment which includes a first set of threads, the fuel injector body including a second set of threads configured to engage with the first set of threads for changing the length of the second segment to preload the piezoelectric stack.

13. A Method of operating an electrical actuator system comprising the steps of:
changing an electrical energy state of an electrical actuator of the electrical actuator system;
moving a control element coupled with the electrical actuator against a bias of a biasing spring that includes a cylindrical rolled sheet defining a longitudinal center axis, in response to the step of changing an electrical energy state; and
reducing non-uniformity in a spring constant of the cylindrical rolled sheet during the step of moving at least in part by distributing a stiffness of a helical weld seam within the cylindrical rolled sheet radially uniformly about the longitudinal center axis;
the stiffness being distributed radially uniformly about the cylindrical rolled sheet via a helical seam having a radial path about the longitudinal center axis which is an integer multiple of 360°.

14. The method of claim 13 wherein the step of changing an electrical energy state includes energizing the electrical actuator, and wherein the step of moving a control element includes moving the control element against a compressive bias of the biasing spring.

15. The method of claim 14 wherein the control element includes a contact element, the method further including a step of moving a control valve of a fuel injector via the contact element to control a fuel injection timing in a fuel injector.

16. A biasing device for an actuator comprising:
a biasing spring including a cylindrical rolled sheet having a first spring end and a second spring end and defining a longitudinal center axis, the cylindrical rolled sheet being configured to change in length in a direction parallel to the longitudinal center axis to bias the actuator; and
the cylindrical rolled sheet further having a helical weld seam located between the first spring end and the second spring end and having a shape adapted to reduce non-uniformity in a spring constant of the biasing spring, the helical weld seam including a radial path having a turn about the longitudinal center axis substantially equal to 360°, such that a stiffness of the helical weld seam is distributed within the cylindrical rolled sheet with radial uniformity.

17. The biasing device of claim 16 wherein the biasing spring includes a multi-function spring having a plurality of longitudinal segments, including a first longitudinal segment having a piston configured to translate motion of the actuator, a second longitudinal segment which includes the cylindrical rolled sheet and the helical seam and is configured to bias the actuator, and a third longitudinal segment which includes a set of threads configured for setting a preload on the actuator.

18. The biasing device of claim 17 wherein the helical seam has a uniform helical angle about the longitudinal center axis and defines a path which is an integer multiple of 360°.

19. The biasing device of claim 16 wherein:
the cylindrical rolled sheet includes a plurality of straight peripheral edges, including a first straight peripheral edge at the first spring end of the cylindrical rolled sheet, a second straight peripheral edge at the second spring end of the cylindrical rolled sheet and a third straight peripheral edge and a fourth straight peripheral edge joined at the helical seam;
the cylindrical rolled sheet further includes an inner diameter and an outer diameter and defines a plurality of voids communicating between the inner diameter and the outer diameter, the plurality of voids having a shape, arrangement and number;
the spring constant includes a net spring constant defined in part by the shape, arrangement and number of the plurality of voids and also in part by the shape of the helical weld seam, and wherein the plurality of voids are offset from the helical weld seam and are not intersected by the helical seam.

* * * * *

UNITED STATES PATENT AND TRADEMARK OFFICE
CERTIFICATE OF CORRECTION

PATENT NO.       : 7,950,596 B2                               Page 1 of 1
APPLICATION NO.  : 12/215545
DATED            : May 31, 2011
INVENTOR(S)      : Venkataraghavan et al.

It is certified that error appears in the above-identified patent and that said Letters Patent is hereby corrected as shown below:

In the Claims

Column 9, line 61, in Claim 13, delete "Method" and insert -- method --.

Signed and Sealed this
Twenty-first Day of July, 2015

Michelle K. Lee
*Director of the United States Patent and Trademark Office*